(12) United States Patent
Boivin et al.

(10) Patent No.: US 12,342,734 B2
(45) Date of Patent: Jun. 24, 2025

(54) PHASE-CHANGE MEMORY (71) Applicants: STMicroelectronics (Crolles 2) SAS, Crolles (FR); STMICROELECTRONICS (ROUSSET) SAS, Rousset (FR)

(72) Inventors: Philippe Boivin, Venelles (FR); Roberto Simola, Trets (FR); Yohann Moustapha-Rabault, Saint-Egrève (FR)

(73) Assignees: STMicroelectronics (Crolles 2) SAS, Crolles (FR); STMICROELECTRONICS (ROUSSET) SAS, Rousset (FR)

(*) Notice: Subject to any disclaimer, the term of this patent is extended or adjusted under 35 U.S.C. 154(b) by 0 days.

(21) Appl. No.: 18/646,334

(22) Filed: Apr. 25, 2024

(65) Prior Publication Data
US 2024/0276894 A1    Aug. 15, 2024

Related U.S. Application Data (63) Continuation of application No. 17/507,645, filed on Oct. 21, 2021, now Pat. No. 12,004,432.

(30) Foreign Application Priority Data

Oct. 29, 2020 (FR) ..................................... 2011087

(51) Int. Cl.
H10B 63/00    (2023.01)
H10N 70/00    (2023.01)
H10N 70/20    (2023.01)

(52) U.S. Cl.
CPC .......... *H10N 70/231* (2023.02); *H10B 63/80* (2023.02); *H10N 70/021* (2023.02);
(Continued)

(58) Field of Classification Search
CPC .. H10N 70/231; H10N 70/021; H10N 70/063; H10N 70/066; H10N 70/068;
(Continued)

(56) References Cited

U.S. PATENT DOCUMENTS 7,969,771 B2    6/2011    Xi et al.
8,971,089 B2    3/2015    Karpov et al.
(Continued)

FOREIGN PATENT DOCUMENTS

CN    101626060 A    1/2010
CN    110943161 A    3/2020
(Continued)

OTHER PUBLICATIONS

Gao et al., "The ovonic threshold switching Characteristics in SixTe1-X based selector devices," *Applied Physics A* 124(734): 2018, 8 pages.
(Continued)

*Primary Examiner* — Michael T Tran
(74) *Attorney, Agent, or Firm* — Seed IP Law Group LLP (57) ABSTRACT

The present description concerns a device including phase-change memory cells, each memory cell including a first resistive element in lateral contact with a second element made of a phase-change material.

20 Claims, 7 Drawing Sheets (52) U.S. Cl.
CPC ......... *H10N 70/063* (2023.02); *H10N 70/066* (2023.02); *H10N 70/068* (2023.02); *H10N 70/882* (2023.02); *H10N 70/883* (2023.02)

(58) Field of Classification Search
CPC .. H10N 70/882; H10N 70/883; H10N 70/011; H10N 70/821; H10N 70/823; H10N 70/8413; H10N 70/8828; H10B 63/80
USPC .................................................. 365/158, 163
See application file for complete search history.

(56) References Cited

U.S. PATENT DOCUMENTS

| | | | |
|---|---|---|---|
| 10,510,951 | B1 | 12/2019 | Yu et al. |
| 11,614,642 | B2* | 3/2023 | Castillo ................. G02F 1/0147 359/288 |
| 11,882,684 | B2 | 1/2024 | Widjaja et al. |
| 11,882,708 | B2 | 1/2024 | Seo |
| 2004/0203183 | A1 | 10/2004 | Cho et al. |
| 2005/0161747 | A1 | 7/2005 | Lung et al. |
| 2007/0242504 | A1 | 10/2007 | Wicker |
| 2008/0048213 | A1 | 2/2008 | Liu |
| 2009/0057643 | A1 | 3/2009 | Chen |
| 2009/0184306 | A1 | 7/2009 | Mathew et al. |
| 2009/0184309 | A1 | 7/2009 | Mathew et al. |
| 2010/0006814 | A1 | 1/2010 | Chen et al. |
| 2014/0264244 | A1 | 9/2014 | Hong et al. |
| 2018/0090542 | A1* | 3/2018 | Gourvest ............... H10B 63/82 |
| 2019/0131520 | A1 | 5/2019 | Morin et al. |
| 2019/0131521 | A1 | 5/2019 | Morin et al. |
| 2019/0140176 | A1 | 5/2019 | Arnaud et al. |
| 2019/0267543 | A1 | 8/2019 | Katono et al. |
| 2019/0312088 | A1 | 10/2019 | Boivin et al. |
| 2019/0326510 | A1* | 10/2019 | Boivin ................... H10B 63/30 |
| 2019/0386213 | A1 | 12/2019 | Lai et al. |
| 2020/0066978 | A1 | 2/2020 | Jeon et al. |
| 2020/0066985 | A1 | 2/2020 | Park et al. |
| 2020/0075854 | A1 | 3/2020 | Park et al. |
| 2020/0098989 | A1 | 3/2020 | Canvel et al. |
| 2020/0136036 | A1 | 4/2020 | Wu et al. |
| 2020/0152870 | A1 | 5/2020 | Lin et al. |
| 2020/0161370 | A1 | 5/2020 | Kuo |
| 2020/0168792 | A1* | 5/2020 | Song .................. H10N 70/8413 |
| 2020/0328347 | A1 | 10/2020 | Leobandung |
| 2020/0395537 | A1 | 12/2020 | Ok et al. |
| 2020/0411695 | A1 | 12/2020 | Sung et al. |
| 2021/0013095 | A1 | 1/2021 | Tran et al. |
| 2021/0091307 | A1* | 3/2021 | BrightSky ............ H10N 70/826 |
| 2021/0104665 | A1* | 4/2021 | Heo ..................... H10N 70/231 |
| 2022/0140233 | A1 | 5/2022 | Boivin |
| 2024/0023468 | A1 | 1/2024 | Fleury et al. |

FOREIGN PATENT DOCUMENTS

| | | |
|---|---|---|
| CN | 113555501 A | 10/2021 |
| KR | 20070094194 A | 9/2007 |
| WO | WO 2004057618 A2 | 7/2004 |
| WO | WO 2021176908 A1 | 9/2021 |

OTHER PUBLICATIONS

Kim et al., "High-performance, cost effective 2z nm two-deck cross-point memory integrated by self-align scheme for 128 Gb SCM," IEEE International Electron Devices Meeting (IE-DM), Dec. 1-5, 2018, San Francisco, California, pp. 851-854.
Hou, "Magnetic thin film Fe ring structures and devices," dissertation, University of Washington, 2014, 178 pages.
Verdy et al., "Improved Electrical Performance Thanks to Sb and N Doping in Se-Rich GeSe-Based OTS Selector Devices," 2017 IEEE International Memory workshop (IMW), Monterey, CA, USA, 2017, pp. 1-4.

* cited by examiner

PHASE-CHANGE MEMORY

CROSS-REFERENCE TO RELATED APPLICATION(S)

This application claims the priority benefit of French patent application number 20/11087, filed on Oct. 29, 2020, entitled "Phase-change memory", which is hereby incorporated by reference to the maximum extent allowable by law.

BACKGROUND

Technical Field

The present disclosure generally concerns electronic devices and their manufacturing methods, and more particularly devices comprising phase-change memories.

Description of the Related Art

In a usual phase-change memory, for example, each memory cell includes a layer of a phase-change material, which is in contact with a resistive element. Phase-change materials are materials that may switch between a crystal phase and an amorphous phase. Such a switching is caused by an increase in the temperature of the resistive element through which an electric current is conducted. The difference in electric resistance between the amorphous phase of the material and its crystal phase is used to define at least two memory states, arbitrarily 0 and 1.

Memories are generally in the form of arrays, comprising word lines and bit lines, that is, rows and columns. A memory cell, containing binary information, is located at each crossing of a row and of a column.

The data contained in a cell of a phase-change memory are, for example, accessed, or read out, by measurement of the resistance between the bit line and the word line of the memory cell.

The phase-change memory cells are for example located in an interconnection network. Interconnection network designates a stack of insulating layers, forming during the so-called "back end of line" manufacturing steps, having metal track coupled together by conductive vias located therein. Typically, the levels of the interconnection network, each comprising conductive tracks in an insulating layer and conductive vias in an insulating layer, have a constant height.

BRIEF SUMMARY

An embodiment overcomes all or part of the disadvantages of known phase change memories.

An embodiment provides a device comprising phase-change memory cells, each memory cell comprising a first resistive element in lateral contact with a second element made of a phase-change material.

An embodiment provides a method of manufacturing a device comprising phase-change memory cells, the method comprising forming, for each cell, a first resistive element in lateral contact with a second element made of a phase-change material.

According to an embodiment, the second element has a spacer shape.

According to an embodiment, the second element has an L shape.

According to an embodiment, the second element comprises a lower surface in contact with a third conductive element, the third element being surrounded with a first insulating layer.

According to an embodiment, the first element is separated from the first insulating layer and from the third conductive element by an insulating portion.

According to an embodiment, the first element is a planar and horizontal layer.

According to an embodiment, a first sidewall of the first element is in contact with a substantially vertical portion of the second element.

According to an embodiment, a second sidewall of the first element, opposite to the first wall, is in contact with a conductive strip.

According to an embodiment, a second sidewall of the first element, opposite to the first wall, is in contact with a fourth selection element, the fourth element being covered with a conductive strip.

According to an embodiment, the device comprises an interconnection network, and each memory cell is located between two levels of the interconnection network.

According to an embodiment, the second element is made of a chalcogen-based alloy, in some embodiments of an alloy based on germanium, tellurium, and antimony, and the first element is made of metal, in some embodiments of titanium nitride or of titanium-silicon nitride.

According to an embodiment, the thickness of the first element is in the range from 2 nm to 20 nm, the dimension of the first element in a first horizontal direction is smaller than 70 nm, the dimension of the first element in a second horizontal direction is in the range from 10 nm to 50 nm, the height of the second element is in the range from 30 nm to 80 nm, the dimension of the second element in a first horizontal direction is smaller than 70 nm, and the dimension of the second element in a second horizontal direction is in the range from 10 nm to 40 nm.

According to an embodiment, the method comprises: forming a stack of layers, the stack comprising, in this order, a second insulating layer, a third layer made of the material of the first element, and a fourth insulating layer; forming a first cavity crossing the stack and exposing a first sidewall of the third layer; and forming the second element on the first wall.

According to an embodiment, the method comprises forming a second cavity exposing a second lateral surface of the first element.

According to an embodiment, the method comprises forming the strip on the second lateral surface of the first element.

According to an embodiment, the method comprises forming the fourth selection element, on the second lateral surface of the first element.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and in some embodiments within 5%.

Figure 1A:
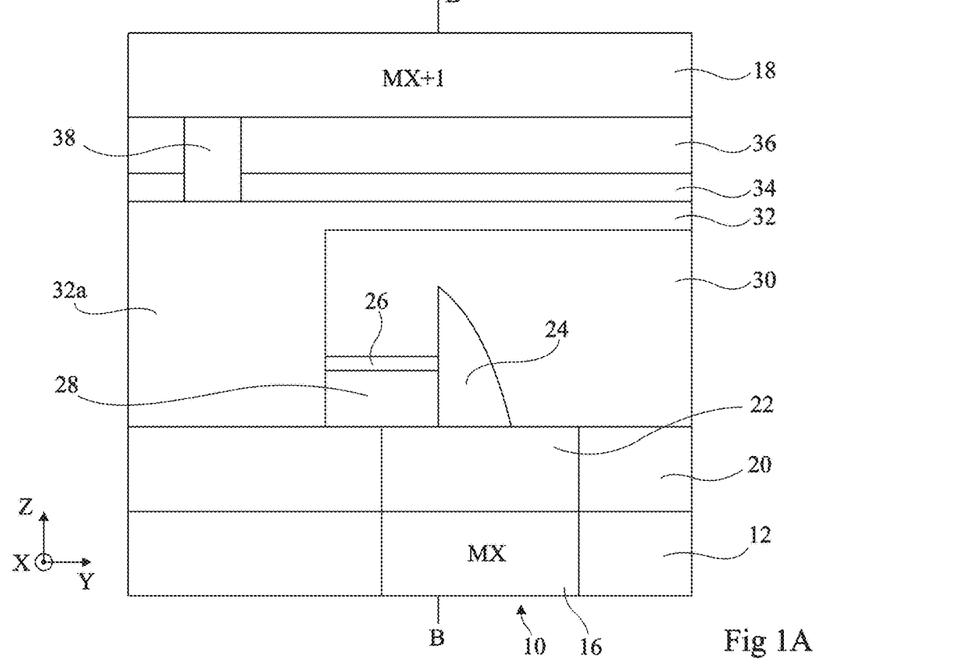
FIG. 1A shows a cross-section view of an embodiment of a phase-change memory cell.
Figure 1B:
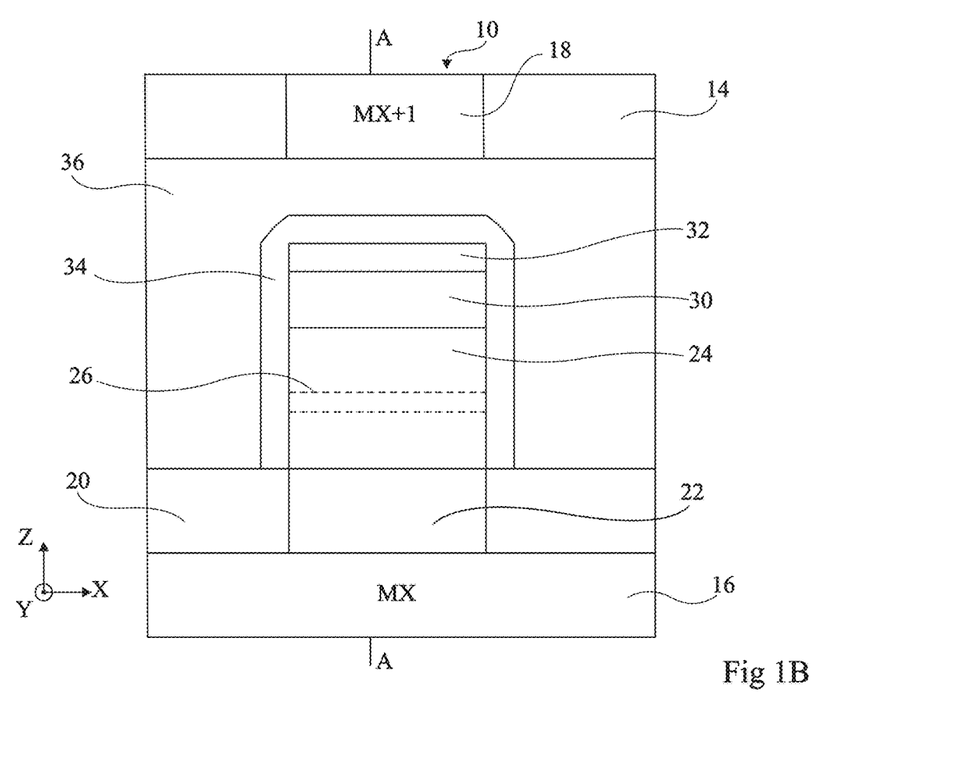
FIG. 1B shows a cross-section view of an embodiment of a phase-change memory cell.

FIG. 1A shows a cross-section view of an embodiment of a phase-change memory cell 10. FIG. 1B shows a cross-section view of phase-change memory cell 10. More particularly, FIG. 1A shows a cross-section view of a portion of a device comprising cell 10 along a plane A-A of FIG. 1B and FIG. 1B shows a cross-section view of a portion of a device comprising cell 10 along a plane B-B of FIG. 1A.

Cell 10 is located in a back-end-of-line level, e.g., an interconnection network, of the device. The interconnection network may be a plurality of conductive and dielectric layers that work together to create an integrated circuit. Cell 10 is here located between a metal track level or metallization level MX and a metal track level or metallization level MX+1 of the interconnection network. FIGS. 1A and 1B show an insulating layer 12 of the interconnection level MX located under memory cell 10 and an insulating layer 14 of the interconnection level MX+1 located above memory cell 10.

A conductive track 16 is located in insulating layer 12 in the metallization level MX. Track 16 crosses layer 12, that is, extends all along the height of layer 12. Track 16 for example extends along a plurality of memory cells such as that shown in FIGS. 1A and 1B. Track 16 for example extends in a direction X, in the x-axis, e.g., corresponding to the direction of a word line. Track 16 is thus in some embodiments coupled to the cells of the word line.

A conductive track 18 is located in insulating layer 14 in the metallization level MX+1. Track 18 crosses layer 14, that is, extends all along the height of layer 14. Track 18 for example extends along a plurality of memory cells such as those shown in FIGS. 1A and 1B. Track 18 for example extends along a direction Y, in the y-axis, e.g., corresponding to the direction of a bit line. Track 18 is thus in some embodiments coupled to the cells of the bit line. Track 18 in some embodiments extends in a direction orthogonal to the direction along which track 16 extends.

The materials of insulating layers 12 and 14 are in some embodiments materials having a very low dielectric constant, that is, so-called "Ultra Low K" materials.

Conductive tracks 16 and 18 are made of conductive materials, e.g., metal. The conductive tracks are in some embodiments made of copper or of tungsten.

An insulating layer 20, in some embodiments, made of silicon nitride, is located on insulating layer 12 and on conductive track 16. Insulating layer 20 covers and is in contact with insulating layer 12, except for cavities thoroughly crossing the layer at the level of each memory cell. Each cavity is filled with a conductive material to form a conductive element 22, for example, a pad 22. Each pad 22 is in contact with a conductive track 16, in some embodiments a single track 16. FIGS. 1A and 1B show a single cell 10 and show a single pad 22. Each memory cell comprises a pad 22, in some embodiments a single pad 22. Pads 22 are, in some embodiments, made of a conductive material, e.g., metal, in some embodiments, of tungsten.

In some embodiments, layers 12, 14, and 20 are planar and parallel layers. In other words, each of layers 12, 14, and 20 comprises a lower surface and an upper surface, planar and horizontal, and substantially parallel to each other. Further, the upper and lower surfaces of the different layers 12, 14, and 20 are in some embodiments parallel to one another. Tracks 16 and 18 and pads 22 thoroughly cross, in vertical direction Z or in the z-axis, respective layers 12, 14, and 20. Tracks 16 and 18 and pads 22 each have an upper surface and a lower surface, planar and horizontal, in some embodiments, substantially parallel to each other. The lower and upper surfaces of tracks 16 and 18 and pads 22 are respectively coplanar with the lower and upper surfaces of layers 12, 14, and 20.

As a variant, pads 22 may be replaced with a conductive track extending on track 16, made of the material of pads 22.

Cell 10 comprises an element 24 made of a phase-change material. Element 24 is for example made of a chalcogen-based alloy, for example, of an alloy based on germanium, tellurium, and antimony (GST). Element 24 rests on and is in contact with the pad 22 of the shown cell 10.

Element 24 has a spacer shape. More particularly, element 24 comprises a lower or horizontal surface in contact with pad 22. The lower surface of element 24 is substantially planar. The lower surface of element 24 is horizontal, that is, it extends in the plane of the upper surface of pad 22, in other words the lower surface of element 24 is in the plane formed by directions X and Y. In direction X, that is, the direction along which the word line extends, element 24 in some embodiments extends over a portion of the dimension of pad 22. Thus, the dimension of the lower surface of element 24 in direction X is in some embodiments substantially equal to the dimension of pad 22, in some embodiments is substantially equal to the dimension of the upper surface of pad 22. In direction Y, that is, the direction along which the bit line extends, element 24 in some embodiments extends over a portion of the dimension of pad 22. Thus, the dimension of the lower surface of element 24 in direction Y is in some embodiments smaller than the dimension of the upper surface of pad 22. The lower surface of element 24 for example substantially has the shape of a parallelogram.

Element 24 comprises a vertical surface, e.g., a surface that is substantially plumb in the z-axis. The vertical surface extends from the upper surface of pad 22 in a direction Z, or in the z-axis, orthogonal to the directions X and Y. The vertical surface for example extends in a plane substantially orthogonal to the plane of the lower surface. The vertical surface in some embodiments extends in the plane of FIG. 1B, that is, an x-z plane formed by directions X and Z. The vertical surface of element 24 for example substantially has a parallelogram shape.

Element 24 comprises lateral surfaces. The lateral surfaces extend from the upper surface of pad 22 in direction Z. The lateral surfaces for example extend in a plane substantially orthogonal to the plane of the lower surface. The lateral surfaces in some embodiments extend in the plane of FIG. 1A. The lateral surfaces of element 24 are in some embodiments each coplanar with a lateral surface of pad 22.

Element 24 comprises another surface, in some embodiments in contact with all the other surfaces. Said other surface is in some embodiments curved.

As a variant, element 24 may be directly located on track 16, if conductive tracks 16 are made of a material which does not degrade the material of element 24, for example, of tungsten. Element 24 is then directly located on track 16 and layer 20 and pads 22 are then absent.

Pads 22 are useful in the case where tracks 16 are made of copper or of another material capable of degrading the phase-change material during the manufacturing of the device. It is then advantageous to ensure that element 24 is not in contact with conductive track 16.

Cell 10 further comprises a resistive element 26. Element 26 is shown in FIG. 1B by dotted lines. Resistive element 26 is in some embodiments made of a conductive material, e.g., metal, for example, or titanium nitride or of titanium silicon nitride. Resistive element 26 is a layer extending horizontally. Resistive element 26 in some embodiments extends in a plane substantially parallel to the upper surface of layer 20. Resistive element 26 in some embodiments comprises an upper surface and a lower surface, substantially parallel to each other, and in some embodiments substantially parallel to the upper surface of layer 20. Element 26 for example substantially has a cuboid shape.

Resistive element 26 extends from element 24, in some embodiments, from the vertical surface of element 24. Resistive element 26 is thus in contact with element 24. In some embodiments, a lateral surface of element 26 is in contact with the vertical surface of element 24. Thus, element 26 is in lateral contact with element 24. Element 26 is for example entirely located at a same distance from the upper surface of layer 20 as element 24. Element 26 is a planar horizontal layer. Resistive element 26 extends, in direction X, over the dimension of element 24, as shown in FIG. 1B. The lateral surfaces of element 26 are in some embodiments coplanar with the lateral surfaces of element 24. Element 26 is thus not located under or over element 24. Element 24 is not separated from tracks 18 and 16 by element 26. A portion of element 24 is located above the level of element 26 and a portion is located under the level of element 26. The horizontal dimension of element 24 in the cross-section plane of FIG. 1B, that is, the dimension in direction X, is for example smaller than 70 nm, for example, in the range from 20 nm to 70 nm, in some embodiments substantially equal to 50 nm. The horizontal dimension of element 26 in the cross-section plane of FIG. 1B, that is, the dimension in direction X, is for example smaller than 70 nm, for example, in the range from 20 nm to 70 nm, in some embodiments is substantially equal to 50 nm.

The horizontal dimension of the lower surface of element 24, that is, the dimension of the interface between element 24 and track 16, in the cross-section plane of FIG. 1A, that is, in direction Y, is for example in the range from 10 nm to 40 nm. The horizontal dimension of element 26 in the cross-section plane of FIG. 1A, that is, the dimension in direction Y, is for example in the range from 10 nm to 50 nm.

The thickness of element 26, that is, the distance between its upper surface and its lower surface, in the z-axis, is smaller than the height of element 24, that is, the dimension of the vertical surface of element 24 in the same direction as the thickness of element 26, that is, direction Z. In some embodiments, the thickness of element 26 is between three and five times smaller than the height of element 24. The height of element 24, that is, its dimension in direction Z, is for example in the range from 30 nm to 80 nm, inclusive. The thickness of element 26, that is, its dimension in direction Z, is for example in the range from 2 nm to 20 nm, inclusive.

Element 26 rests on a region or portion 28 made of an insulating material, for example, of silicon nitride. Element 26 is separated from layer 20 and from pad 22 by region 28 made of an insulating material. Element 26 is thus not in contact with layer 20, pad 22, layer 12, or track 16.

The value of the resistance between element 26 and pad 22 depends on the height of region 28, having the distance between element 26 and the lower surface of element 24 depending thereon. Thus, the height of portion 28 is thus selected according to the desired resistance.

Elements 26 and 24 are covered with an insulating layer 30, for example, made of silicon nitride. Layer 30 further covers pad 22 and a portion of layer 20. A lateral surface of element 26 is left exposed by layer 30. In other words, layer 30 does not cover one of the lateral surfaces of element 26. More particularly, layer 30 in some embodiments does not cover a lateral surface of element 26 opposite to the surface in contact with element 24.

The device comprises, for each bit line, a conductive strip 32. Strip 32 is for example made of a conductive material, e.g., metal, in some embodiments of titanium nitride, of tungsten, or of copper, and strip 32 is not in contact with element 24. Strip 32 comprises a portion 32a extending along layer 30 to reach element 26, more particularly to reach the exposed lateral surface of element 26. Strip 32 is thus in contact with element 26. Element 26 is thus connected, by an end, to element 24 and by another end to strip 32. This portion 32a of strip 32 in some embodiments extends all the way to the upper surface of layer 20. The dimensions of element 26 are such that strip 32 is not in contact with pad 22 or, in the absence of layer 20 and of pad 22, is not in contact with track 16.

Another portion of strip 32 in some embodiments extends on insulating layer 30 to reach another memory cell, not shown in FIGS. 1A and 1B.

Each bit line is surrounded with an insulating layer 34, for example, made of silicon nitride. Layer 34 surrounds the assembly comprising strip 32, insulating layer 30, portion 28, and elements 24 and 26. Layer 34 particularly covers the upper surface of strip 32 and of the sidewalls, in some embodiments coplanar, of strip 32, of insulating layer 30, of portion 28, and of elements 24 and 26.

An insulating layer 36 covers layer 34 and layer 20. Insulating layer 36 is in some embodiments made of a material having a very low dielectric constant ("Ultra Low K"). Layer 36 corresponds to the layer where the conductive vias coupling the conductive tracks MX located in layer 12 to the tracks MX+1 located in layer 14 are formed. Layer 36 separates the different bit lines.

Conductive vias 38 for example cross or extend through layer 36 and layer 34 to couple a track MX+1 to conductive strip 32.

It could have been chosen to form a vertical stack of the resistive element, the phase-change material, and the electrode, that is, strip 32. Thus, it could have been chosen to form a layer made of the phase-change material on the resistive element, and to form the electrode on the layer of phase-change material. However, each cell would have a larger thickness than in the embodiment described in relation with FIGS. 1A and 1B, typically a thickness greater than 150 nm with current technologies. Thus, it would not be possible to locate the memory cells in a standard interconnection network without locally or generally modifying the thickness of the network levels. Such modifications would cause resistance and capacitance variations of the links between levels, which would cause modifications of the behavior of components, for example, transistors, coupled by the interconnection network.

Figure 2:
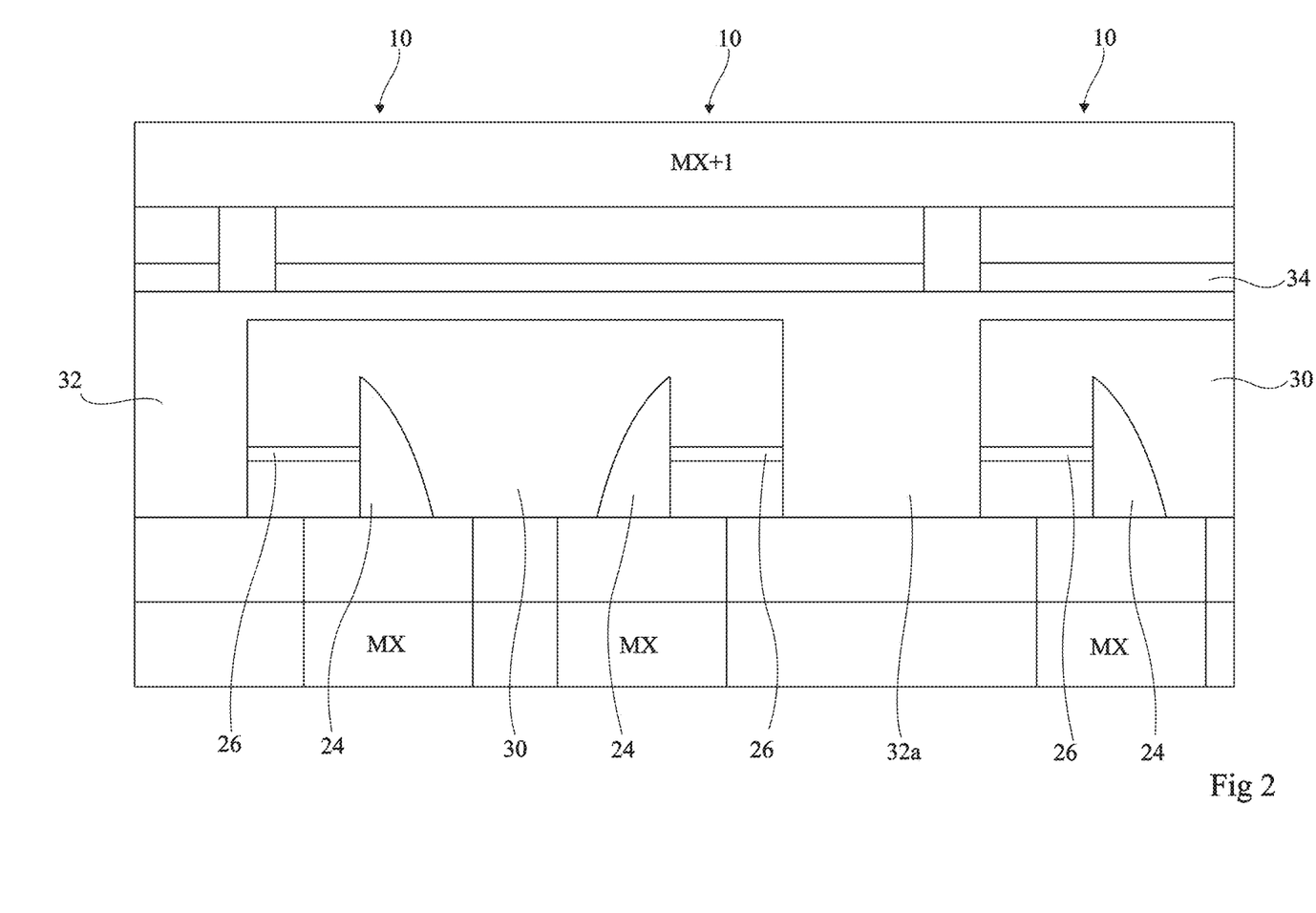
FIG. 2 shows a cross-section view of a device comprising a plurality of cells such as that of FIGS. 1A and 1B.

FIG. 2 shows a cross-section view of a device comprising a plurality of cells such as that of FIGS. 1A and 1B. FIG. 2 is a cross-section view along the plane of FIG. 1A. The elements identical to elements of FIGS. 1A and 1B will not be described again. FIG. 2 shows three memory cells of a same bit line.

The cells are formed like the cells previously described in relation with FIGS. 1A and 1B.

The cells are alternated. In other words, each memory cell corresponds to the planar symmetry of the neighboring cell along a horizontal plane, orthogonal to the plane of FIG. 2.

The elements 26 of two neighboring cells face each other. Similarly, the elements 24 of two neighboring cells face each other.

Each portion 32a of strip 32 extending towards layer 20 is in contact with the elements 26 of two neighboring cells. Thus, each portion 32a of strip 32 extending towards layer 20 allows the contact of two memory cells. There thus are substantially twice as few portions 32a as cells 10.

The elements 26 of two neighboring cells separated by strip 32 are not separated by the elements 24 of the cells. Similarly, the elements 24 of two neighboring cells only separated by layer 30 are not separated by the elements 26 of the cells.

FIGS. 3A to 3F illustrate the results of steps, in some embodiments successive, of an implementation mode of a method of manufacturing the embodiment of FIGS. 1A, 1B, and 2. FIGS. 3A to 3F are cross-section views along the plane of FIG. 1A.

Figure 3A:
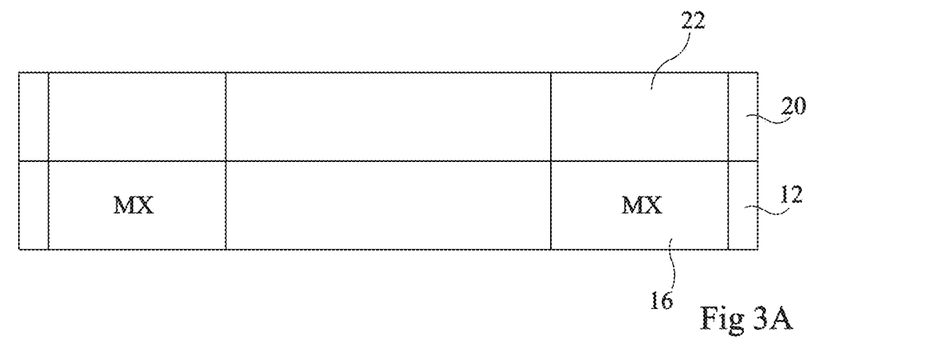
FIG. 3A shows the result of a step of a method of manufacturing the embodiment of FIG. 2.

FIG. 3A shows the result of a step of a method of manufacturing the embodiment of FIG. 2.

This step comprises a step of forming of the interconnection level comprising tracks MX. More particularly, this step comprises the forming of an insulating layer 12. Layer 12 is in some embodiments made of a so-called "Ultra Low K" material, that is, a material having a low dielectric constant.

Cavities crossing layer 12 are formed at the locations of conductive tracks 16. The cavities are then filled with the material of tracks 16, for example, a metal, in some embodiments copper or tungsten, to form said tracks 16. The cavities are filled so that the material of tracks 16 is not located outside of the cavities.

An insulating layer 20 is then formed on layer 12 and on tracks 16. The layer is in some embodiments made of silicon nitride. Cavities crossing layer 20 are formed at the locations of pads 22. The cavities are then at least partially located on tracks 16. The cavities are then filled with the material of pads 22, for example, tungsten, to form said pads 22. The cavities are filled so that the material of pads 22 is not located outside of the cavities.

As a variant, as previously specified, according to the materials of the tracks, layer 20 and pads 22 may not be formed. The steps described hereafter are thus carried out directly on layer 12 and tracks 16.

Figure 3B:
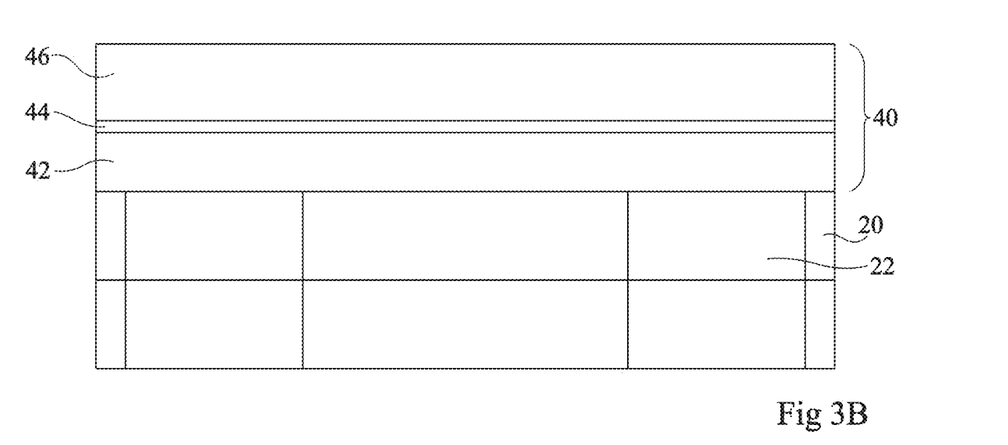
FIG. 3B shows the result of another step of a method of manufacturing the embodiment of FIG. 2.

FIG. 3B shows the result of another step of a method of manufacturing the embodiment of FIG. 2.

During this step, a stack 40 of layers is formed on layer 20 and on pads 22. Stack 40 comprises, in this order from layer 20:
  an insulating layer 42;
  a conductive layer 44; and
  an insulating layer 46.

Insulating layer 42 is made of the material of portion 28 (FIG. 1A), for example, of silicon nitride. Layer 44 is made of the material of resistive element 26, for example, of titanium nitride or of titanium-silicon nitride. Layer 46 is in some embodiments made of the same material as layer 42, for example, of silicon nitride.

The height of stack 40 is substantially equal to the desired height of the vertical surface of element 24 (FIG. 1A). As described in relation with FIGS. 1A and 1B, the height of layer 42, corresponding to the height of portion 28, depends on the desired value of the resistance between element 26 and pad 22.

Figure 3C:
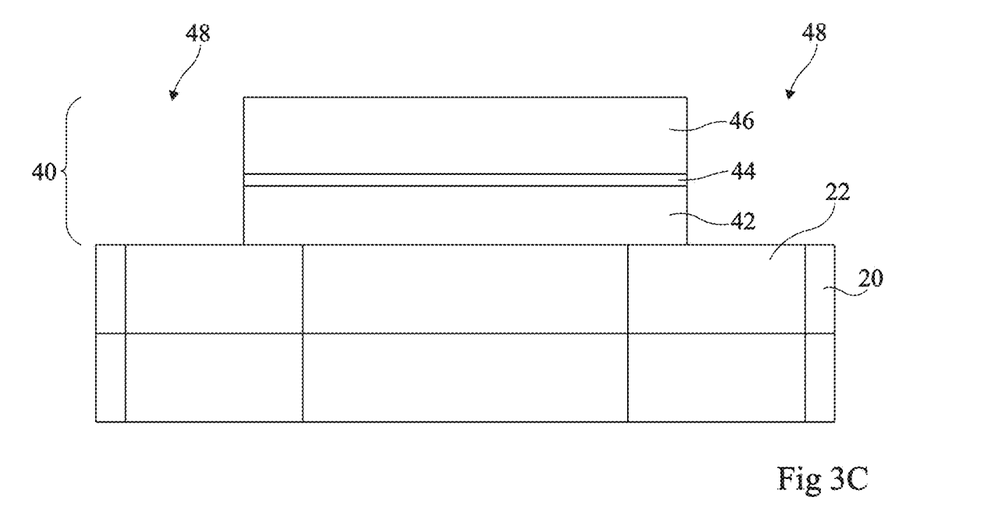
FIG. 3C shows the result of another step of a method of manufacturing the embodiment of FIG. 2.

FIG. 3C shows the result of another step of a method of manufacturing the embodiment of FIG. 2.

During this step, an etching is performed to form cavities 48. Cavities 48 cross stack 40. Thus, the bottom of cavities 48 is formed by layer 20 and by pads 22.

Each cavity 48 extends along the direction of the word lines. Thus, each cavity 48 extends along two neighboring word lines. Further, each cavity 48 extends between two neighboring word lines. Thus, each cavity 48 comprises a wall extending from the pads 22 and from the layer 20 of one of said two neighboring word lines and another wall extending from the pads 22 and from the layer 20 of the other one of said two neighboring word lines. Thus, a portion of a wall of one of cavities 48 extends from each pad 22.

In some embodiments, stack 40 is only partially removed from pads 22. Thus, in some embodiments, stack 40 still partially extends on pads 22.

The walls of cavities 48 are formed of sidewalls of the layers of the stack, that is, of sidewalls of layers 42, 44, and 46. Thus, at the level of each wall of one of cavities 48, layer 44 is exposed. It is thus possible to form an electric connection with layer 44 via each cavity 48.

Figure 3D:
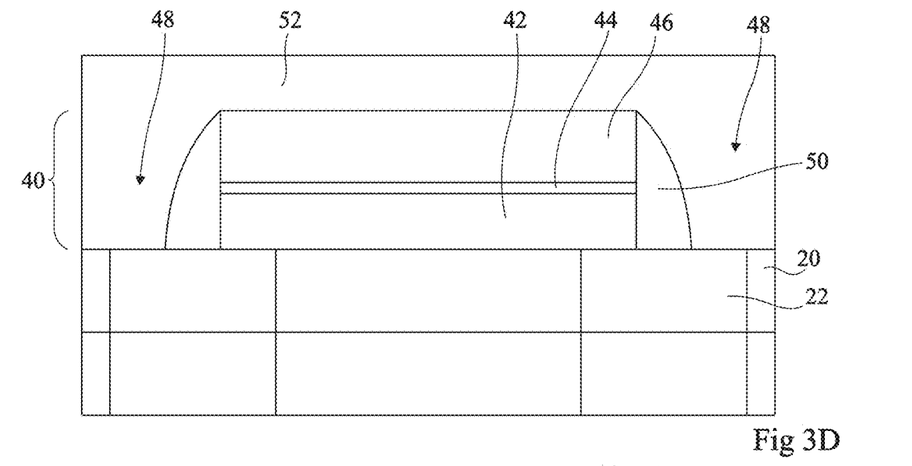
FIG. 3D shows the result of another step of a method of manufacturing the embodiment of FIG. 2.

FIG. 3D shows the result of another step of a method of manufacturing the embodiment of FIG. 2.

During this step, spacers 50 are formed on the walls of cavities 48. More particularly, this step comprises the conformal forming of a layer, not shown, made of the material of spacers 50. Said layer, not shown, particularly covers the walls and the bottom of cavities 48, as well as an upper surface of layer 46. This step then comprises a step of anisotropic etching of the layer, not shown, to remove the portions of the layer, not shown, located on the upper surface of layer 46 and in the middle of the bottom of the cavities. The portions located on the walls of cavities 48 and at the foot of the walls of cavities 48 are thus not removed and form spacers 50.

Spacers 50 extend all along the height of the walls of cavities 48 and over a portion of the pads 22 and of the layer 20 located at the foot of the walls. Thus, each spacer is in contact with the pads 22 of the word line having the wall extending thereon and in contact with the layer 44 exposed at the level of this wall.

The width of spacers 50, that is, the size of the spacers in the direction of the bottom of cavity 48 in FIG. 3C, depends on the height of stack 40. Thus, the thickness of layer 46 is selected to obtain the desired spacer width.

A layer 52 made of an insulating material is formed on the structure, that is, on the upper surface of layer 46, on spacers 50, on pads 22, and on layer 20. Layer 52 is made of the material of layer 30, for example, of silicon nitride.

This step then comprises a step of chemical-mechanical planarization (CMP), to obtain a substantially planar upper surface of layer 52. The thickness of layer 52 such as deposited is sufficient for, after polishing, layer 52 to still cover layer 46, spacers 50, pads 22, and layer 20.

Figure 3E:
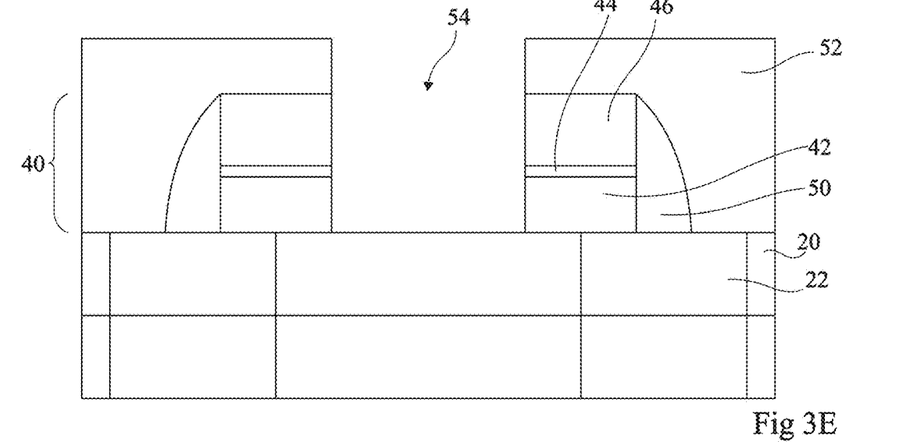
FIG. 3E shows the result of another step of a method of manufacturing the embodiment of FIG. 2.

FIG. 3E shows the result of another step of a method of manufacturing the embodiment of FIG. 2.

This step comprises the forming of cavities 54. Cavities 54 cross layer 52 and stack 40. Cavities 54 reach layer 20. The bottom of cavities 54 is formed by layer 20. The bottom of cavities 54 does not comprise pads 22.

The walls of cavities 54 are formed by walls of insulating layer 42, 46, and 52 and by walls of conductive layer 44. Thus, the etching of cavities 54 exposes portions of layer 44 in cavities 54. The bottom and the walls of cavities 54 do not comprise other conductors than the exposed portions of layer 44.

Cavities 54 extends along the word lines. Thus, cavities 54 in some embodiments extend all along the length of the word lines, and thus, all along the length of stack 40.

Figure 3F:
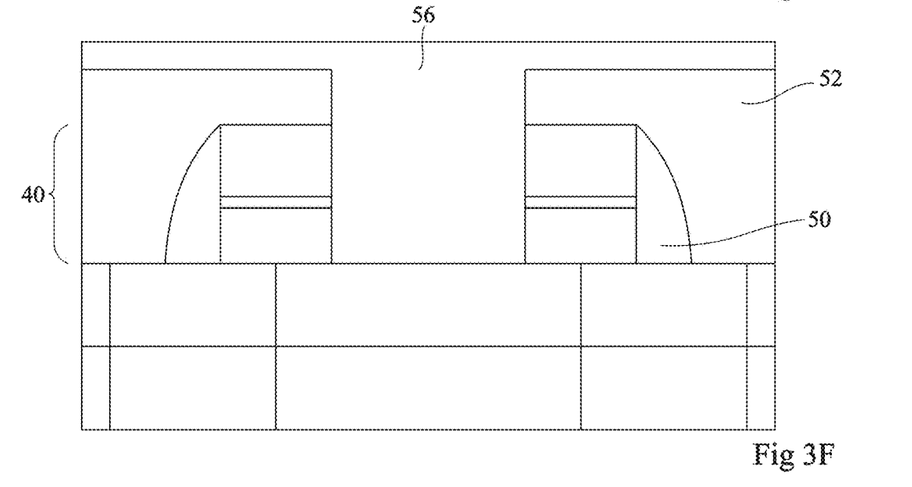
FIG. 3F shows the result of another step of a method of manufacturing the embodiment of FIG. 2.

FIG. 3F shows the result of another step of a method of manufacturing the embodiment of FIG. 2.

During this step, a metal layer 56 is formed over the entire structure. Layer 56 fills cavities 54 and covers layer 52. The material of layer 56 is the material of strip 32 (FIGS. 1A and 1B). Layer 56 is thus for example made of titanium nitride, of tungsten, or of copper.

Layer 56 is in some embodiments etched, in some embodiments by CMP, so that the upper surface of layer 56 is planar. The thickness of layer 56 such as deposited is thus sufficiently large for layer 56, after CMP, to cover layer 52 and to totally fill cavities 54.

The method of manufacturing the memory cells of FIGS. 1A, 1B, and 2 further comprises steps, not shown. In particular, the method comprises the individualization of the cells. In other words, the method comprises etching cavities, not shown, crossing conductive layer 56, insulating layer 52, spacers 50, and stack 40. The cavities, not shown, extend in the bit line direction, that is, in planes parallel to the cross-section plane of FIGS. 3A to 3F. The cavities, not shown, thus separate neighboring memory cells in a same word line. The etching thus separates layer 56 into strips 32 distinct at each cell, layer 42 into portions 28 distinct at each cell, layer 44 into elements 26 distinct at each cell, and spacers 50 into elements 24 distinct at each cell.

The manufacturing method further comprises the forming of insulating layer 34 (FIGS. 1A and 1B), covering the word lines. In particular, layer 34 covers the walls of the cavities, not shown, formed during the cell individualization and covers the upper surface of strips 32.

The method may then comprise the forming of insulating layer 36, for example corresponding to the insulating layer separating layer 12 comprising tracks MX and layer 14 comprising tracks MX+1. Thus, layer 36 is for example crossed by conductive vias connecting tracks MX and tracks MX+1. The level of the interconnection network comprising tracks MX+1 is then formed on layer 36.

An advantage of the embodiment described in relation with FIGS. 3A to 3F, is that the forming of resistive element 26 comprises the forming of a substantially planar layer and not of a layer located on a wall of cavities, as is the case in current technologies, enables to better control the layer thickness. It is thus possible to form a layer having a smaller thickness than in the case of a vertical resistive element. Further, it is easier to accurately etch a planar and horizontal layer than a vertical layer.

Figure 4:
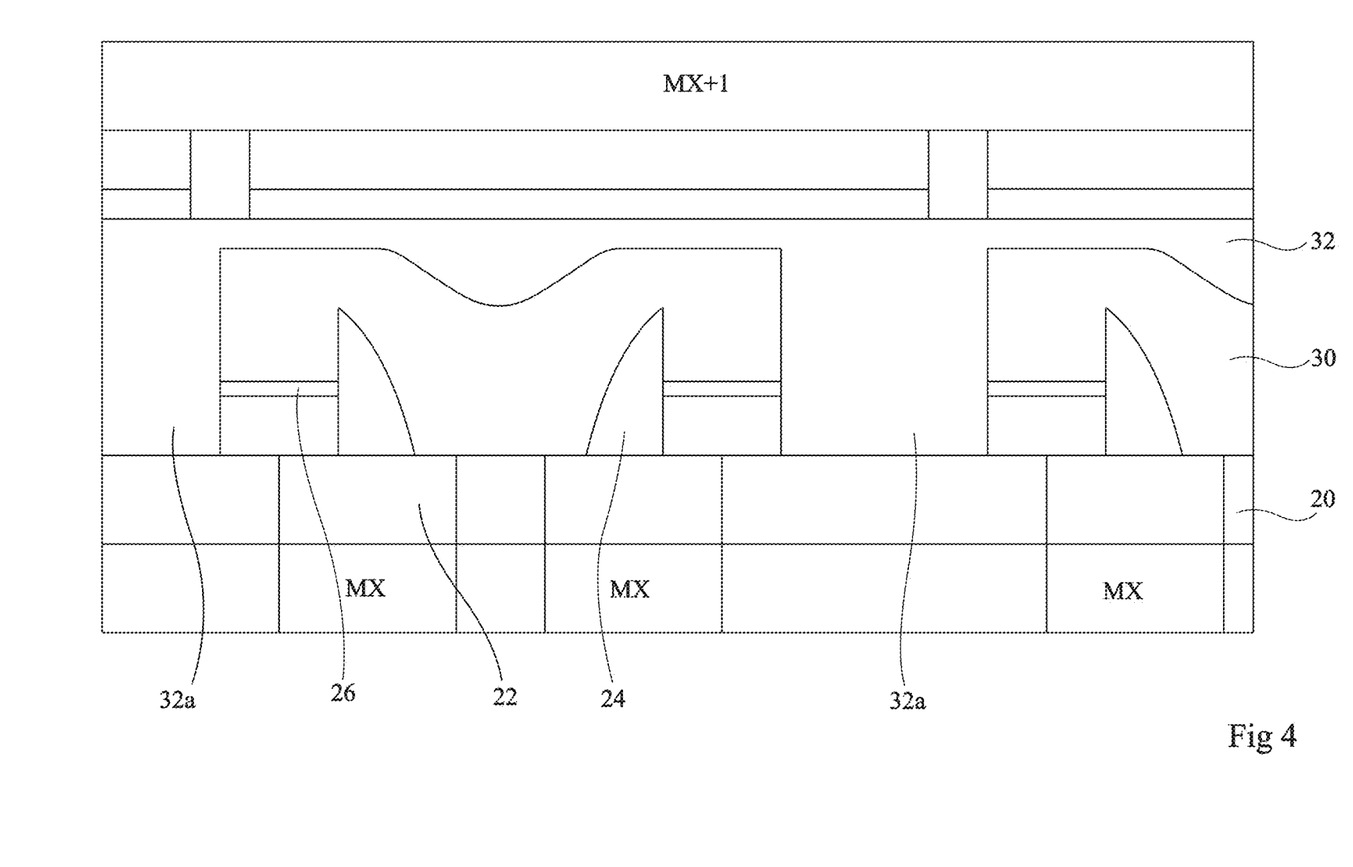
FIG. 4 shows a variant of the embodiments of FIGS. 1A, 1B, and 2.

FIG. 4 shows a variant of the embodiments of FIGS. 1A, 1B, and 2.

The embodiment of FIG. 4 differs from the embodiment of FIGS. 1A, 1B, and 2 in that the upper surface of layer 30 is not planar. More particularly, layer 30 comprises cavities between two neighboring elements 24. In other words, the distance between the upper surface of layer 30 and the planar upper surface of layer 20 may be smaller between elements 24 at said distance at the level of elements 26. These cavities are filled with strip 32.

The embodiment of FIG. 4 is obtained by implementing the method described in relation with FIGS. 3A to 3F, except, advantageously, for the chemical-mechanical step described in relation with FIG. 3D.

Although the upper surface of layer 30 is not planar, strip 32 is not in contact with elements 24 and pads 22. In other words, elements 24 and pads 22 are separated from strip 32 by layer 30, despite the presence of the cavity.

Figure 5:
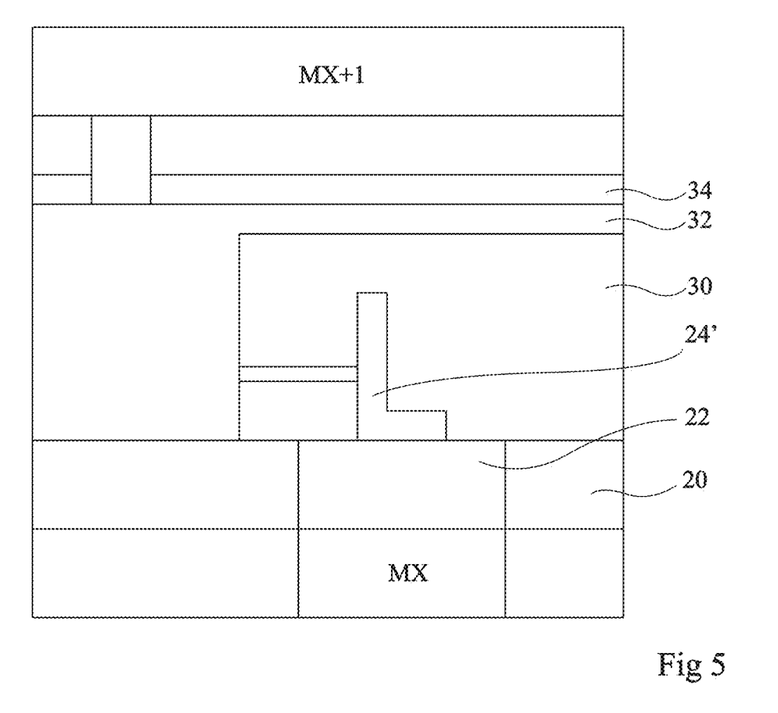
FIG. 5 shows a variant of the embodiment of FIGS. 1A, 1B, and 2.

FIG. 5 shows a variant of the embodiment of FIGS. 1A, 1B, and 2.

The embodiment of FIG. 5 differs from the embodiments of FIGS. 1A, 1B, and 2 in that element 24 is replaced with an element 24' made of a phase-change material, in some embodiments made of the same material as element 24. Conversely to element 24, element 24' does not have the shape of a spacer but an L shape. In other words, element 24' comprises a horizontal portion extending on pad 22 and a vertical portion extending from the upper surface of pad 22 to the upper surface of layer 30.

The method of manufacturing the embodiment of FIG. 5 is identical to the method described in relation with FIGS. 3A to 3F except for the step described in relation with FIG. 3D. In the method of manufacturing the embodiment of FIG. 5, the step of forming element 24 is replaced with a step of forming element 24'. In some embodiments, the step of forming element 24' comprises depositing a conformal layer made of the material of element 24'. Said layer covers, in particular, the bottom and the walls of cavity 48 and the upper surface of layer 46. Said layer for example has a thickness substantially equal to the thickness, that is, to the smallest dimension in the plane of FIG. 5, of the vertical and horizontal portions of element 24'. Said layer is then etched to remove the portions of said layer located on the upper surface of layer 46 and the portions located at the center of the bottom of the cavity. In other words, said layer is then etched to only maintain the portions extending along the walls of cavity 48 and portions located at the foot of the walls of cavity 48, on pad 22.

An advantage of the embodiment of FIG. 5 is that it enables to better control the thickness of element 24' and thus to better determine the resistance of element 24'.

Figure 6:
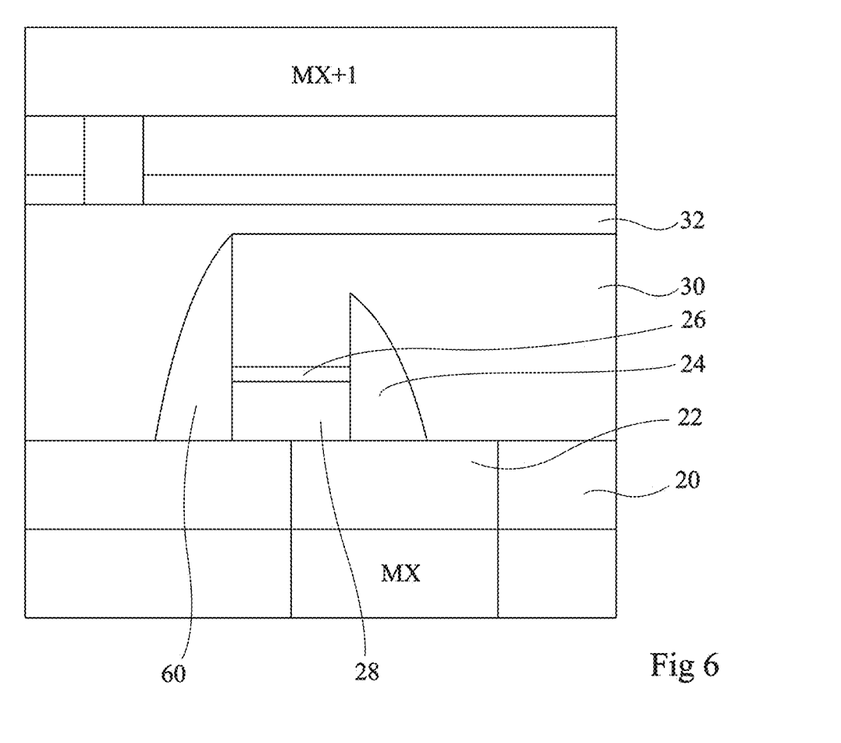
FIG. 6 shows another embodiment of a phase-change memory cell.

FIG. 6 shows another embodiment of a phase-change memory cell.

The embodiment of FIG. 6 differs from the embodiment of FIGS. 1A, 1B, and 2 in that it comprises a selection element 60.

Element 60 in some embodiments has a spacer shape. Element 60 vertically extends on sidewalls of portion 28, of element 26, and of layer 30. Element 60 in some embodiments extends all the way to the upper surface of layer 30. Element 60 extends horizontally on layer 20 at the foot of the sidewall of portion 28.

Element 60 forms the element for selecting each cell. In other words, during the writing into or the reading from a cell, selection element 60 enables current to flow through the element 26 of this cell. The selection element thus enables to limit the current flowing through the other memory cells (not selected) and that might disturb the reading from or the writing into the cell.

Selection element 60 is in some embodiments of ovonic threshold switching type (OTS). Element 60 is for example made of a chalcogen material or of an alloy of chalcogen material. For example, the element is made of germanium, selenium, antimony, or of an alloy of one or a plurality of these chemical elements. In some embodiments, element 60 is made of an alloy of chalcogen materials which optimizes the operating parameters of a threshold switch, or selection element, that is, for example, an alloy comprising:

arsenic, with an atomic percentage in the range from 9% to 39%, germanium, with an atomic percentage in the range from 10% to 40%, silicon, with an atomic percentage in the range from 5% to 18%, nitrogen, with an atomic percentage in the range from 0% to 10%, and an alloy of sulfur, selenium, and tellurium.

In some embodiments, the ratio of the atomic percentage of sulfur to the atomic percentage of selenium in the alloy of sulfur, selenium, and tellurium is in the range from 0.25 to 4, inclusive, and the ratio of the atomic percentage of sulfur to the atomic percentage of tellurium in the alloy of sulfur, selenium, and tellurium is in the range from 0.11 to 1, inclusive. As a variant, the selection element may be made of another material causing a rectifying effect, for example, to form a Schottky diode.

The method of manufacturing the embodiment of FIG. 6 differs from the method described in relation with FIGS. 3A to 3F in that it comprises an additional step of forming of element 60 between the steps of FIGS. 3E and 3F.

During this additional step, spacers are formed on the walls of cavities 54. More particularly, this step comprises the conformal forming of a layer, not shown, made of the material of spacers 60. Said layer, not shown, particularly covers the walls and the bottom of cavities 54, as well as an upper surface of layer 52. This step then comprises a step of anisotropic etching of the layer, not shown, to remove the portions of the layer, not shown, located on the upper surface of layer 52 and in the middle of the bottom of the cavities 54. The portions located on the walls of cavities 54 and at the foot of the walls of cavities 54 are thus not removed and form the spacers.

The spacers extend along the entire height of the walls of cavities 54 and over a portion of layer 20 located at the foot of the walls.

The width of the spacers, that is, the dimension of the spacers in the direction of the bottom of cavity 54, depends on the height of cavity 54. Thus, the thickness of layer 52, in particular above stack 40, is selected to obtain spacers on each side of the cavity, which are not in contact with one another.

An advantage of the described embodiments is that element 24 is confined, that is, element 24 directly heats, by itself, when it conducts a current, instead of being indirectly heated by a resistive element which would heat and would transfer the heat. The power loss, and thus the power consumption, is thus decreased.

As a variant, similarly to element 24, which can be replaced with an L-shaped element 24', selection element 60 may be replaced with an L-shaped element. The modifications to be made to the manufacturing method are similar to those described in relation with FIG. 5.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given herein.

Device may be summarized as including phase-change memory cells, each memory cell (10) including a first resistive element (26) in lateral contact with a second element (24) made of a phase-change material.

The second element (24) may have the shape of a spacer.

The second element (24) may have an L shape.

The second element (24) may include a lower surface in contact with a third conductive element (22), the third element being surrounded with a first insulating layer (20).

The first element (26) may be separated from the first insulating layer (20) and from the third conductive element (22) by an insulating portion (28).

The first element (26) may be a planar and horizontal layer.

A first sidewall of the first element (26) may be in contact with a substantially vertical wall of the second element (24).

A second sidewall of the first element (26), opposite to the first wall, may be in contact with a conductive strip (32).

A second sidewall of the first element (26), opposite to the first wall, may be in contact with a fourth selection element (60), the fourth element (60) being covered with a conductive strip (32).

The device may include an interconnection network, and each memory cell (10) is located between two levels of the interconnection network.

The second element (24) may be made of a chalcogen-based alloy, in some embodiments of an alloy based on germanium, tellurium, and antimony, and the first element (26) may be made of metal, in some embodiments of titanium nitride or of titanium-silicon nitride.

The thickness of the first element (26) may be in the range from 2 nm to 20 nm, the dimension of the first element in a first horizontal direction (X) may be smaller than 70 nm, the dimension of the first element (26) in a second horizontal direction (Y) may be in the range from 10 nm to 50 nm, the height of the second element may be in the range from 30 nm to 80 nm, the dimension of the second element (24) in a first horizontal direction (X) may be smaller than 70 nm, and the dimension of the second element (24) in a second horizontal direction (Y) may be in the range from 10 nm to 40 nm.

Method of manufacturing a device including phase-change memory cells (10), the method may be summarized as including forming, for each cell, the first resistive element (26) in lateral contact with the second element (24) made of a phase-change material.

Method may include forming a stack (40) of layers, the stack (40) including, in this order, a second insulating layer (42), a third layer (44) made of the material of the first element (26), and a fourth insulating layer (46); forming a first cavity (48) crossing the stack (40) and exposing a first sidewall of the third layer (44); and forming the second element (24) on the first wall.

Method may include forming a second cavity (54) exposing a second lateral surface of the first element (26).

Method may include forming the strip (32) on the second lateral surface of the first element (26).

Method including forming the fourth selection element (60) on the second lateral surface of the first element (26).

The various embodiments described above can be combined to provide further embodiments. Aspects of the embodiments can be modified, if necessary, to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   phase-change memory cells, each memory cell of the phase-change memory cells including:
      a first element of a conductive material having a cuboid shape and a first surface transverse a second surface; and
      a second element of a phase-change material having a first surface transverse a second surface, the first surface of the second element contacting the first surface of the first element;
   a first insulating layer covering the first and second elements, the first insulating layer contacting the second surface of the first element and the first surface of the second element, a third surface of the first element being exposed from the first insulating layer, the third surface opposite the first surface of the first element; and
   a conductive strip on the first insulating layer.

2. The device of claim 1, comprising a second insulating layer spaced from the first insulating layer, the second insulating layer contacting a fourth surface of the first element opposite the second surface of the first element, the second insulating layer contacting the first surface of the second element.

3. The device of claim 2, comprising a selection element contacting the first and second insulating layers and the third surface of the first element.

4. The device of claim 3, wherein the selection element has a spacer shape.

5. The device of claim 4, wherein the selection element is made of chalcogen material, an alloy of chalcogen, or ovonic threshold switching type (OTS).

6. The device of claim 1, comprising:
   a third element of a conductive material contacting the second surface of the second element, the third element being spaced from the conductive strip; and
   a conductive track contacting the third element.

7. The device of claim 1, comprising a conductive track, the second surface of the second element contacting the conductive track.

8. The device of claim 7, wherein the conductive track is made of tungsten.

9. The device of claim 1, wherein the third surface of the first element contacts the conductive strip.

10. A device, comprising:
    a plurality of first elements of a conductive material having a cuboid shape and a first surface transverse a second surface;
    a plurality of second elements of a phase-change material having a first surface transverse a second surface, the first surface of each second element contacting the first surface of each first element, respectively;
    a first insulating layer covering the plurality of first and second elements, the first insulating layer contacting the second surface of each first element and the first surface of each second element, a third surface of each first element being exposed from the first insulating layer, the third surface opposite the first surface of each first element, respectively; and
    a conductive strip on the first insulating layer.

11. The device of claim 10, comprising a second insulating layer having a plurality of portions, each portion of the second insulating layer extending between each second element and the conductive strip, respectively, a fourth surface of each first element contacting each portion of the second insulating layer, respectively, the fourth surface being opposite the second surface of each first element, respectively.

12. The device of claim 10, wherein the conductive strip separates adjacent first elements facing each other.

13. The device of claim 10, wherein the first insulating layer separates adjacent second elements facing each other.

14. The device of claim 10, wherein the first insulating layer has a first surface that is non-planar surface and contacts the conductive strip.

15. The device of claim 11, wherein the first insulating layer includes cavities between the adjacent second elements, the conductive strip extending in the cavities.

16. A method, comprising:
    forming a plurality of first elements of a conductive material having a cuboid shape and a first surface transverse a second surface;
    forming a plurality of second elements of a phase-change material having a first surface transverse a second surface, the first surface of each second element contacting the first surface of each first element, respectively;
    forming a first insulating layer covering the plurality of first and second elements, the first insulating layer contacting the second surface of each first element and the first surface of each second element, a third surface of each first element being exposed from the first insulating layer, the third surface opposite the first surface of each first element, respectively; and
    forming a conductive strip on the first insulating layer.

17. The method of claim 16, wherein forming the plurality of first elements includes:
    forming a stack of a first layer of insulating material, a second layer of conductive material, and a third layer of insulating material, the second layer of conductive material being between the first and second layers of insulating material; and etching first cavities in the stack; and wherein forming the plurality of second elements includes each second element being in a respective first cavity.

18. The method of claim 17, wherein forming the first insulating layer includes forming a fourth layer of insulating material over the first layer of insulating material and the plurality of second elements.

19. The method of claim 18, wherein forming the conductive strip includes:

forming second cavities through the stack and the fourth layer of insulating material; and filling the second cavities with a fifth layer of conductive material.

20. The method of claim 19, comprising individualizing phase-change memory cells each having at least one first element and at least one second element, each phase-change memory cell having a thickness less than 150 nm, the thickness being in a first direction from the first layer of insulating material to the third layer of insulating material.

* * * * *